United States Patent
Besser et al.

[11] Patent Number: 6,150,285
[45] Date of Patent: Nov. 21, 2000

[54] METHOD FOR SIMULTANEOUS DEPOSITION AND SPUTTERING OF TEOS

[75] Inventors: Paul R. Besser, Sunnyvale; Minh Van Ngo, Union City, both of Calif.

[73] Assignee: Advanced Micro Devices, Inc., Sunnyvale, Calif.

[21] Appl. No.: 09/099,057

[22] Filed: Jun. 17, 1998

[51] Int. Cl.$^7$ .......................... H01L 21/31; H01L 21/469
[52] U.S. Cl. .................. 438/787; 438/624; 438/695; 438/710; 438/788; 438/790
[58] Field of Search ................... 438/624, 697, 438/787, 788, 790, 710, 694, 695, 696; 257/634

[56] References Cited

U.S. PATENT DOCUMENTS

| | | | |
|---|---|---|---|
| 5,089,442 | 2/1992 | Olmer | 438/631 |
| 5,494,854 | 2/1996 | Jain | 438/692 |
| 5,814,564 | 9/1998 | Yao et al. | 438/723 |
| 5,885,894 | 3/1999 | Wu et al. | 438/624 |
| 5,915,200 | 6/1999 | Tokumasu et al. | 438/623 |
| 5,968,610 | 10/1999 | Liu et al. | 438/788 |

OTHER PUBLICATIONS

Lutze et al. "Techniques for Reducing the Reverse Short Channel Effect in Sub–0.5 micron CMOS", IEEE, pp. 373–375, Sep. 1995.

*Primary Examiner*—Carl Whitehead, Jr.
*Assistant Examiner*—Maria Guerrero
*Attorney, Agent, or Firm*—LaRiviere, Grubman & Payne, LLP

[57] ABSTRACT

A method for making 0.25 micron semiconductor chips includes using TEOS as the high density plasma (HDP) inter-layer dielectric (ILD). More specifically, after establishing a predetermined aluminum line pattern on a substrate, TEOS is deposited and simultaneously with the TEOS deposition, excess TEOS is etched away, thereby avoiding hydrogen embrittlement of and subsequent void formation in the aluminum lines that could otherwise occur if silane were used as the HDP ILD.

6 Claims, 2 Drawing Sheets

METHOD FOR SIMULTANEOUS DEPOSITION AND SPUTTERING OF TEOS

TECHNICAL FIELD

The present invention relates generally to semiconductor fabrication, and more particularly to methods for establishing inter-layer dielectrics (ILD) for semiconductors having small gaps between metal lines 0.25μ technology.

BACKGROUND OF THE INVENTION

Semiconductor chips or wafers are used in many applications, including as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

In chips that hold integrated circuits, the individual circuit components are interconnected by conductive elements referred to as "interconnect lines". These interconnect lines are typically arranged in a multi-layered pattern that is deposited on a semiconductive substrate such as silicon. To insulate the interconnect lines from each other, insulative material is deposited between adjacent interconnect line layers.

With the above in mind, so-called 0.25 micron technology has been developed, in which the distance between adjacent layers of interconnect lines in an integrated circuit on a semiconductor chip is equal to or less than about three-eighths of a micron. With such a small spacing between interconnect lines, which have heights of about 1.1 microns, the size of the circuits on the chip can be reduced to result in the above-noted advantages.

Typically, each electrically conductive interconnect line is made of a "stack" of metal layers that typically includes a layer made of aluminum or aluminum alloy, and one or more other metal layers. The aluminum is deposited as a film over the substrate and is then lithographically patterned and chemically etched to form a desired pattern for the circuit's connector lines. Then, a process referred to as high density plasma (HDP) inter-layer dielectric (ILD) formation is used to fill the gaps between adjacent metal stacks with an electrically non-conductive material.

HDP ILD formation is preferred for 0.25μ technology over the older plasma enhanced chemical vapor deposition (PECVD) process. When ILD is deposited over and between the stacks, voids can form in the ILD between the stacks. Such void formation would reduce the insulation between adjacent stacks and thus lead to undesirable short circuits within the chip. In the PECVD process, to avoid ILD void formation it is necessary to sequentially deposit ILD and then etch away excess ILD, with repeat iterations being necessary to ensure that voids do not form in the ILD between the stacks. It happens that as the distance between adjacent stacks is decreased to the 0.375μ range, the problem of void formation is exacerbated and, hence, the shortcomings of the PECVD process magnified. On the other hand, in the HDP process the ILD material is deposited over and between the interconnect lines while simultaneously being sputtered away, thereby avoiding the formation of voids in the insulative material between the closely-spaced metal stacks while reducing fabrication time and, thus, increasing manufacturing throughput.

In HDP ILD formation, silane is used as the dielectric material. Silane has been preferred over tetraethoxy silane (TEOS) in 0.25μ semiconductor technology because it has a relatively high deposition rate, thus allowing for faster fabrication of the chips (and, hence, higher manufacturing throughput). Moreover, the process using silane is relatively easy to control with excellent quality. Also, silane is relatively inexpensive, compared to TEOS.

As recognized herein and confirmed by tests conducted by the present assignee, however, silane produces free hydrogen gas during fabrication, and it is to this problem that the present invention is addressed. More particularly, as recognized by the present invention free hydrogen gas is adsorbed by the aluminum, resulting in undesirable embrittlement of the aluminum. This is undesirable because, as the present invention understands, such embrittlement can promote the subsequent formation of voids in the aluminum that can be caused by mechanical stresses. These stresses arise largely because the thermal expansion coefficient of the mechanically constrained aluminum layer is different from the thermal expansion coefficient of the encapsulating oxide and the silicon substrate. When a void forms in a thin aluminum line, the current path through the line unfortunately is diverted, thereby adversely affecting the reliability of the chip.

Fortunately, the present invention recognizes that contrary to previous methods, TEOS can be used as the inter-layer dielectric in 0.25μ semiconductors. More particularly, the present invention recognizes that because the use of TEOS results in the production of relatively little or no free hydrogen, hydrogen embrittlement of aluminum in 0.25μ semiconductors consequently can be significantly reduced or indeed eliminated by using TEOS instead of silane, thereby improving 0.25μ chip reliability.

BRIEF SUMMARY OF THE INVENTION

A method is disclosed for making a semiconductor chip having electrically conductive interconnect lines. The method includes providing at least one substrate, and establishing at least one predetermined pattern of electrically conductive interconnect lines on the substrate. In accordance with the present invention, TEOS is then deposited between and on top of the lines by directing TEOS onto the lines while simultaneously removing excess TEOS. Preferably, the TEOS is removed by directing a sputtering agent against the TEOS at about a forty five degree (45°) angle.

In a preferred embodiment, the substrate includes a semiconductor, and each conductive line defines a stack that includes a layer of titanium on the substrate and a layer of aluminum or aluminum alloy on the layer of titanium. Preferably, the establishing step includes depositing a layer of aluminum film and etching the film to establish the predetermined pattern. As disclosed in detail below, the step of etching the aluminum film is accomplished using a chemical etchant. On the other hand, the step of sputtering the TEOS is accomplished using argon gas. A chip is also disclosed that is made by the above process, and a computing device incorporating the chip is further disclosed.

In another aspect, a semiconductor chip includes at least one substrate, and at least one predetermined pattern of aluminum lines is supported by the substrate. Adjacent lines are separated by distances equal to or less than about three-eighths of a micron. Moreover, a TEOS dielectric material is between at least the first and second lines.

In still another aspect, a method for making a semiconductor chip includes establishing plural electrically conductive lines on at least one substrate, with at least some lines being spaced from each other by distances equal to or less than three-eighths of a micron. Additionally, the method includes depositing TEOS between at least two lines that are adjacent each other, such that little or no free hydrogen is produced during the depositing step.

Other features of the present invention are disclosed or apparent in the section entitled: "DETAILED DESCRIPTION OF THE INVENTION."

BRIEF DESCRIPTION OF DRAWINGS

For fuller understanding of the present invention, reference is made to the accompanying drawing in the following detailed description of the Best Mode of Carrying Out the Present Invention. In the drawings.

Figure 1:
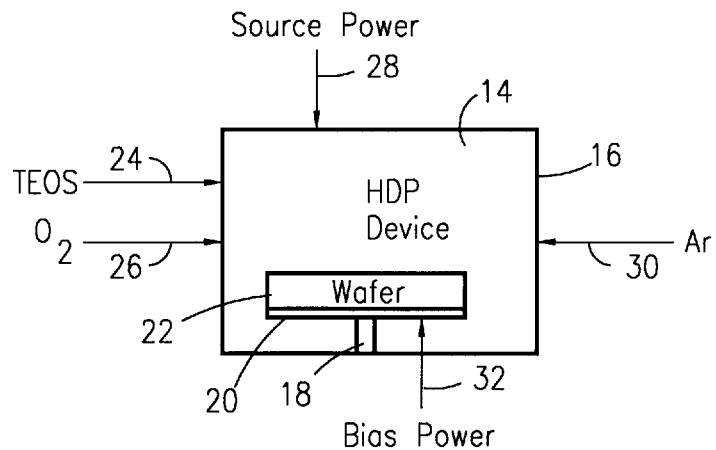
FIG. 1 is a schematic diagram of a high density plasma gap fill deposition chamber.

Reference numbers refer to the same or equivalent parts of the present invention throughout the several figures of the drawing. In the description, the terms "vertical" and "horizontal" refer to the orientations of the figures shown, for purposes of disclosure, and do not necessarily refer to the orientation of the present wafer once the wafer is embodied in a computing device.

DETAILED DESCRIPTION OF THE INVENTION

Referring initially to FIG. 1, the process of the present invention in producing $0.25\mu$ technology computer chips can best be understood with an initial explanation of the high density plasma (HDP) gap fill deposition chamber used in the present process. The present process envisions using TEOS as the inter-layer dielectric (ILD) during an HDP gap fill deposition process, and an HDP chamber 14 is accordingly shown in FIG. 1. The chamber 14 is enclosed by a wall 16. A support 18 is disposed in the chamber 14, and the support 18 may hold an e-chuck 20. One or more wafers or substrates 22 are in turn disposed on the e-chuck 20.

To provide for depositing ILD on the wafer 22, a TEOS inlet 24 and an oxygen inlet 26 are associated with the chamber wall 16 to respectively direct TEOS and oxygen into the chamber 14, and a source power lead 28 is likewise associated with the chamber 14. In the preferred embodiment, TEOS is directed into the chamber 14 at a rate ranging from one half milliliter per minute to three milliliters per minute (0.5 mL/min–3.0 mL/min). In contrast, oxygen is directed into the chamber 14 at a rate ranging from ten standard cubic centimeters per minute to fifty standard cubic centimeters per minute (10 SCCM–50 SCCM). The pressure within the chamber 14 is maintained between one milliTorr and three Torr (1 mTorr–3 Torr), and the source power applied to the chamber 14 is between five hundred watts and five thousand watts (500 w–5000 w).

To provide for simultaneous sputtering of TEOS while the TEOS is being deposited, an etchant inlet 30 is associated with the wall 16 to port a gaseous etchant, preferably argon, into the chamber 14. Also, a bias power lead 32 is connected to the e-chuck 20, and bias power is maintained at about three thousand watts (3000 w).

Figure 2:
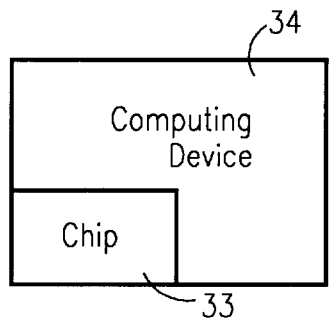
FIG. 2 is a schematic diagram of a computing device incorporating the present $0.25\mu$ technology semiconductor chip.

FIG. 2 shows a computer chip, generally designated 33, that is produced using the chamber 14 in consonance with the process described below. The chip 33 can establish an integrated circuit such as a microprocessor or a flash memory chip (e.g., an electrically programmable memory (EPROM)) for use in the computer arts. As shown in FIG. 2, the chip 33 can be incorporated into a computing device 34, e.g., a computer, digital camera, wireless telephone, or hand held computer, for use by the computing device 34.

Figure 3:
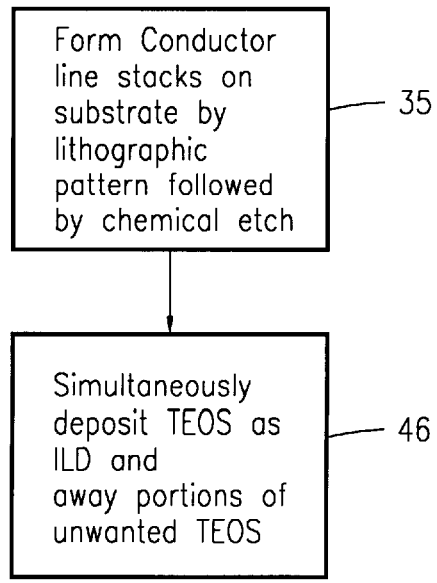
FIG. 3 is a flow chart of the process for making the chip shown in FIG. 1.
Figure 4:
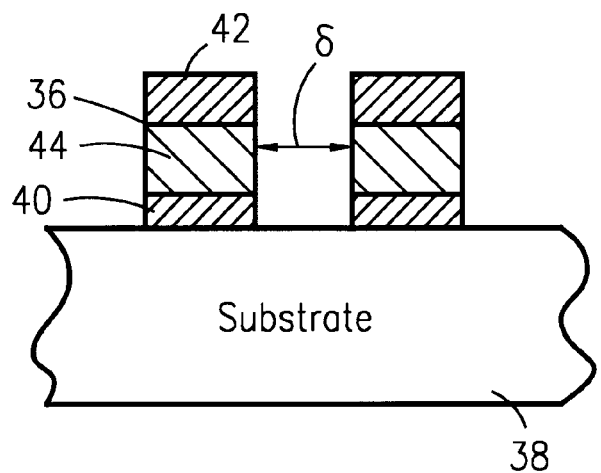
FIG. 4 is a schematic diagram of the substrate from the word line direction showing the chip after conductor line stack formation.
Figure 5:
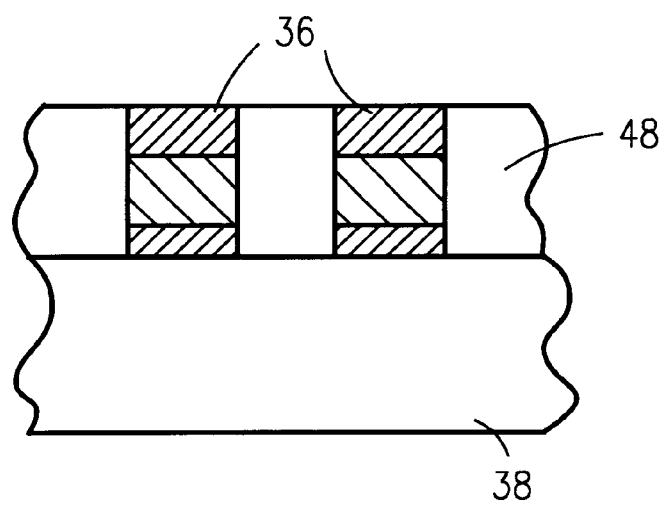
FIG. 5 is a schematic diagram of the substrate from the word line direction showing the chip after TEOS deposition/etching.

With the above disclosure in mind, the present process can now be understood with reference to FIGS. 3–5. Commencing at block 35 in FIG. 3 and referring particularly to FIG. 4, plural stacks 36 are formed on a substrate 38. Each stack 36 is a metallic, electrically-conductive stack that defines a respective interconnect line for an integrated circuit chip, such as the chip 33 shown in FIG. 2. Although only two stacks 36 are shown for clarity of disclosure, it is to be understood that more than two stacks typically are formed on the substrate 38.

Preferably, the substrate 38 includes a semiconductor such as silicon. Also, the substrate 38 can include a number of devices, such as metal oxide silicon field effect transistor (MOSFET) devices, that are electrically connected to one or more of the stacks 36 via connector plugs.

In the preferred embodiment, each stack 36 includes a respective lower titanium layer 40 abutting the substrate 38, an upper titanium layer 42 parallel to and spaced from the lower titanium layer 40, and an aluminum layer 44 sandwiched therebetween. The titanium layers can be titanium or a titanium alloy such as titanium nitride. It is to be understood that greater or fewer layers can be provided. In a preferred embodiment, the aluminum layer 44 is made of aluminum or an aluminum alloy including aluminum and from 0.1% to about 10% by weight of one or more of copper, nickel, zinc, gold, titanium, indium, chromium, silver, palladium, and platinum.

In accordance with HDP principles, the stacks are deposited on the wafer substrate 38 in accordance with means known in the art, e.g., by depositing the various metallic layers as films, covering the films with a mask, and then directing ultraviolet light against the exposed portions of the films. After lithographic patterning, chemical etching is used to remove portions of metal not in the pattern to establish the predetermined pattern of aluminum conductive lines of the chip 33, as shown in FIG. 4.

As can be appreciated in reference to FIG. 4, the chip 33 shown in FIGS. 2, 4, and 5 is a so-called "quarter micron chip", in that the distance 6 between adjacent stacks 36 is about equal to or less than three-eighths of a micron $(0.375\mu)$.

Moving to block 46 of FIG. 3 and referring to FIG. 5, owing to the cooperation between the TEOS, oxygen, and source power that are associated with the chamber 14 by means disclosed above, TEOS 48 is deposited by vapor deposition onto and between the stacks 36. Simultaneously with the vapor deposition process, the TEOS on the aluminum stacks 36 is sputtered away by the cooperation between the argon gas directed into the chamber 14 at the etchant inlet 30 (FIG. 1) and the bias power lead 32, such that the TEOS 48 forms a continuous inter-layer dielectric layer between the aluminum stacks 36, substantially free of voids in the dielectric. If desired, chemical-mechanical polishing (CMP) can be used to polish the surface of the chip 33 to the configuration shown in FIG. 5.

With this structure, not only is the TEOS ILD layer 48 established without voids, but undesirable voids are less likely to form as well in the metal stacks 36. Such voids could otherwise be formed in the stacks 36 were silane to be used instead of TEOS, because the use of TEOS, unlike the use of silane, results in the production of little or no free hydrogen that could embrittle the aluminum in the stacks 36.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims, in which reference to an element in the singular is not intended to mean "one and only one" unless explicitly so stated, but rather "one or more". The inventions illustratively disclosed herein may be practiced without any element which is not specifically disclosed herein.

What is claimed is:

1. A method for making a semiconductor chip having electrically conductive lines, comprising:

providing at least one substrate;

supporting the substrate on an e-chuck in a chamber;

energizing the e-chuck with electrical power;

establishing at least one pattern of electrically conductive lines on the substrate; and depositing TEOS between the electrically conductive lines by directing TEOS onto the lines while simultaneously porting Argon into the chamber through an inlet port to remove excess TEOS.

2. The method of claim 1, wherein the step of removing the TEOS is accomplished using sputtering.

3. The method of claim 1, wherein each line establishes a stack including at least one layer having aluminum therein.

4. The method of claim 3, wherein each stack includes at least one layer having titanium therein.

5. The method of claim 4, wherein the establishing step includes depositing a layer of aluminum film and etching the film to establish the pattern.

6. The method of claim 5, wherein the step of etching the aluminum film is accomplished using a chemical etchant.

* * * * *

UNITED STATES PATENT AND TRADEMARK OFFICE
CERTIFICATE OF CORRECTION

PATENT NO.   : 6,150,285
DATED        : November 21, 2000
INVENTOR(S)  : Paul R. Besser, Minh Van Ngo It is certified that error appears in the above-identified patent and that said Letters Patent is hereby corrected as shown below:

<u>Column 4,</u>
Line 52, after the word distance, please delete [6] and replace with -- $\delta$ --.

Signed and Sealed this

Twenty-fifth Day of September, 2001

Attest:

NICHOLAS P. GODICI
Attesting Officer    Acting Director of the United States Patent and Trademark Office